(12) United States Patent  
Fan

(10) Patent No.: US 7,654,863 B2  
(45) Date of Patent: Feb. 2, 2010

(54) ELECTRICAL CONNECTOR ASSEMBLY

(75) Inventor: Chia-Wei Fan, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/215,567

(22) Filed: Jun. 26, 2008

(65) Prior Publication Data

US 2009/0004893 A1 Jan. 1, 2009

(30) Foreign Application Priority Data

Jun. 26, 2007 (CN) .......................... 200720038907

(51) Int. Cl.  
*H01R 13/60* (2006.01)

(52) U.S. Cl. .................. 439/567; 439/573; 439/70; 439/159

(58) Field of Classification Search ................. 439/74, 439/661, 564, 573, 70, 159  
See application file for complete search history.

(56) References Cited

U.S. PATENT DOCUMENTS

| 5,088,935 | A  | * | 2/1992  | Dise et al. ................... 439/573 |
| 5,754,409 | A  | * | 5/1998  | Smith ......................... 361/803 |
| 6,354,871 | B1 | * | 3/2002  | Hatakeyama ............... 439/573 |
| 6,469,905 | B1 | * | 10/2002 | Hwang ....................... 361/756 |
| 7,252,544 | B2 | * | 8/2007  | Wada et al. ................. 439/573 |

* cited by examiner

*Primary Examiner*—Truc T Nguyen  
(74) *Attorney, Agent, or Firm*—Andrew C. Cheng; Wei Te Chung; Ming Chieh Chang

(57) ABSTRACT

An electrical connector assembly (100) in accordance with a preferred embodiment of the present invention, comprises an electrical connector (200) for connecting an electronic package with a circuit substrate (60) and a connecting device (300) for fixing the electrical connector (200) to the circuit substrate (60). The electrical connector (200) includes a housing assembly (1) with a plurality of contacts (10) received therein. The connecting device (1) includes a first screw (70), a second screw (90) and a nut (80) connecting the first screw (70) and the second screw (90). The nut (80) connecting with the first screw (70) makes the first screw (70) securely located on the housing assembly (1) and prevents the first screw (70) losing in the transportation.

16 Claims, 4 Drawing Sheets

ELECTRICAL CONNECTOR ASSEMBLY

BACKGROUND OF THE INVENTION

1. Field of the Invention

The present invention relates to an electrical connector assembly, and particularly to an electrical connector assembly having improved connecting device for fixing the electrical connector with other member, such as a printed circuit board (PCB).

2. Description of the Prior Art

Electrical connectors are widely used in electrically connecting electronic packages, such as Land Grid Array (LGA) Central Processing Units (CPU), with circuit substrate, such as printed circuit boards (PCB).

Referring to FIG. 4, a conventional electrical connector assembly 100' is illustrated. The electrical connector assembly 100' comprises an electrical connector 1' for electrically connecting a CPU 5' with a PCB 2', a number of screws 3' and nuts 4'. The connector 1' comprises a number of first holes 11' and the PCB 2' comprises a number of second holes 21' accordingly to the first holes 11'. When the electrical connector 1' is assembled to the PCB 2', first assemble the screw 3' to the electrical connector 1', and the screw 3' go through the first holes 11' and the second holes 21', then put the nut 4' matched with the screw 3'. Thus make the electrical connector 1' securely fastened with the PCB 2'.

As the miniaturization development of the electrical connector, the screw and the nut become smaller relatively, so when shipped or before assembled, they are easily lost. Thus make a inconvenience when assembled the electrical connector to the PCB.

In view of the above, a new electrical connector assembly that overcomes the above-mentioned disadvantages is desired.

SUMMARY OF THE INVENTION

Accordingly, an object of the present invention is to provide an electrical connector assembly that can securely and expediently fastening the electrical connector with the PCB.

To fulfill the above-mentioned object, an electrical connector assembly (100) in accordance with a preferred embodiment of the present invention, comprises an electrical connector for connecting an electronic package with a circuit substrate and a connecting device for fixing the electrical connector to the circuit substrate. The electrical connector includes a housing assembly with a plurality of contacts received therein. The connecting device includes a first screw, a second screw and a nut connecting the first screw and the second screw. The nut connecting with the first screw making the first screw securely located on the electrical connector.

Other objects, advantages and novel features of the invention will become more apparent from the following detailed description when taken in conjunction with the accompanying drawings.

DETAILED DESCRIPTION OF THE PREFERRED EMBODIMENT OF THE INVENTION

Reference will now be made to the drawings to describe the present invention in detail.

Figure 1:
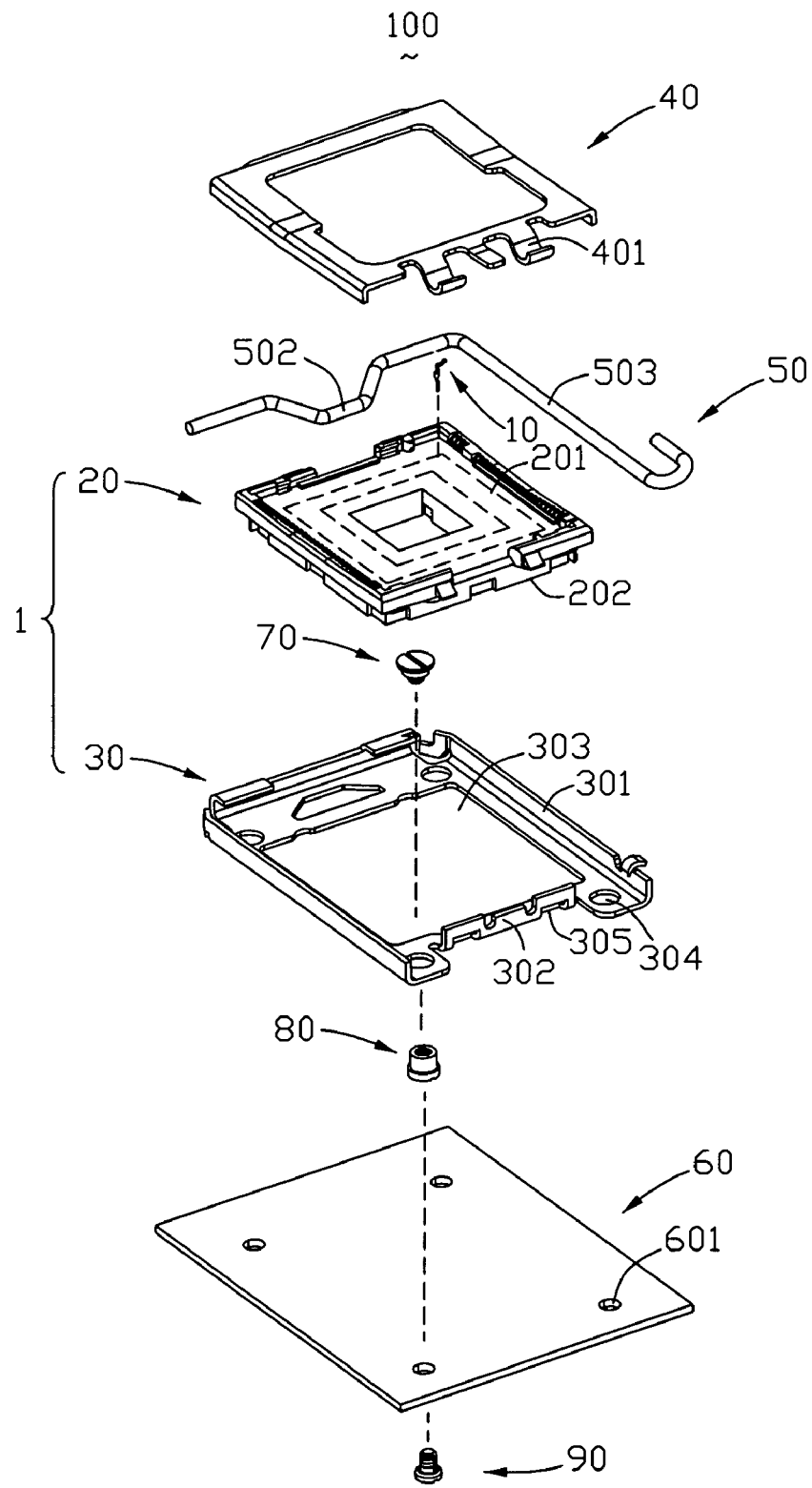
FIG. 1 is an exploded view of an electrical connector assembly of the present invention.
Figure 2:
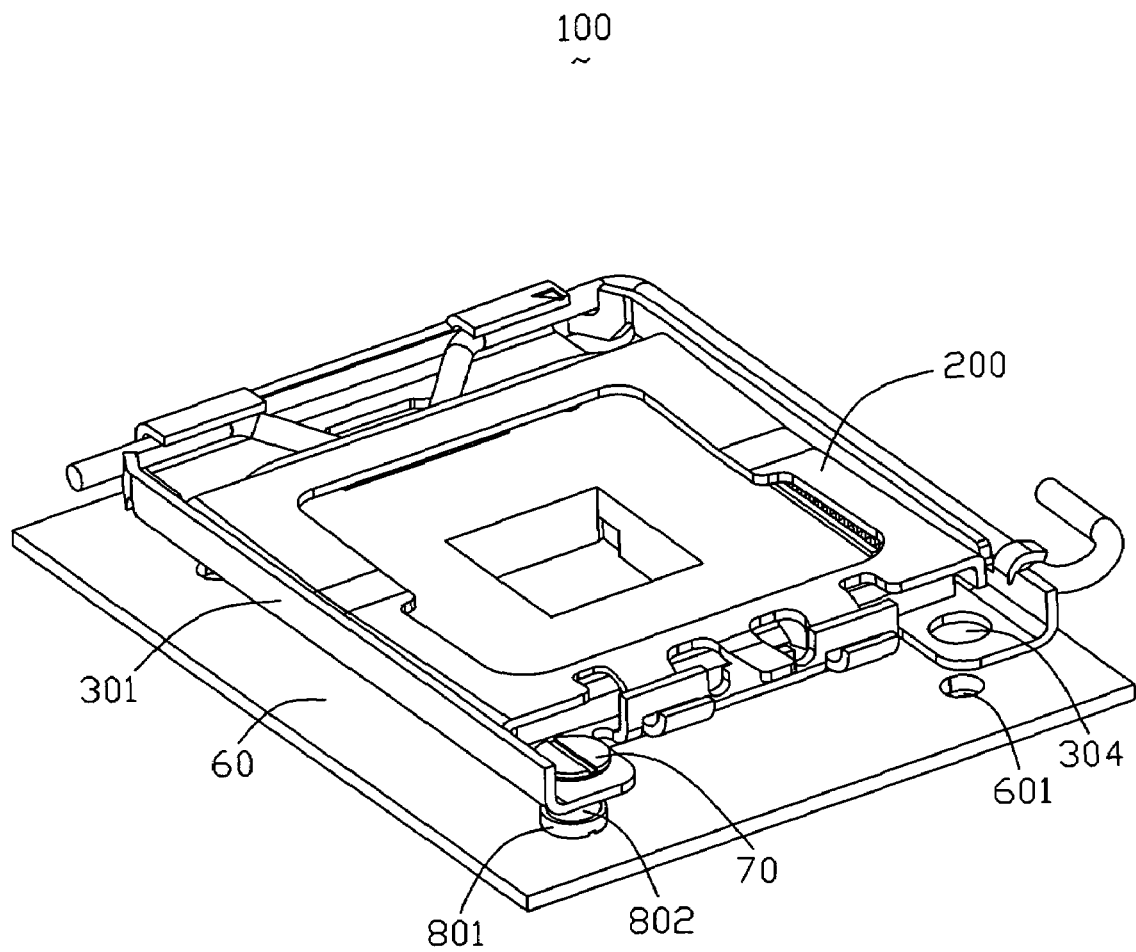
FIG. 2 is an assembled view of the electrical connector assembly of FIG. 1.
Figure 3:
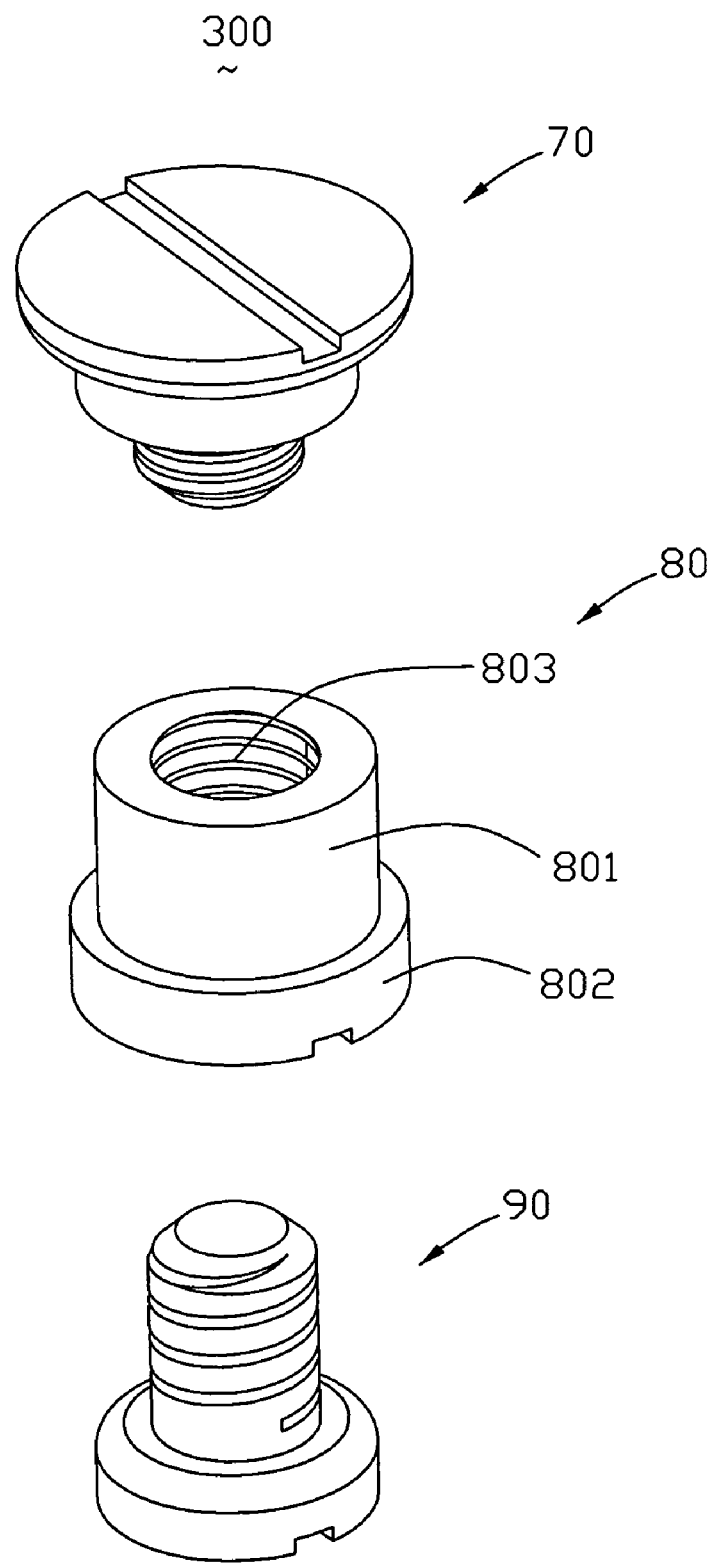
FIG. 3 is an exploded view of the connecting device of the electrical connector assembly of FIG. 1.
Figure 4:
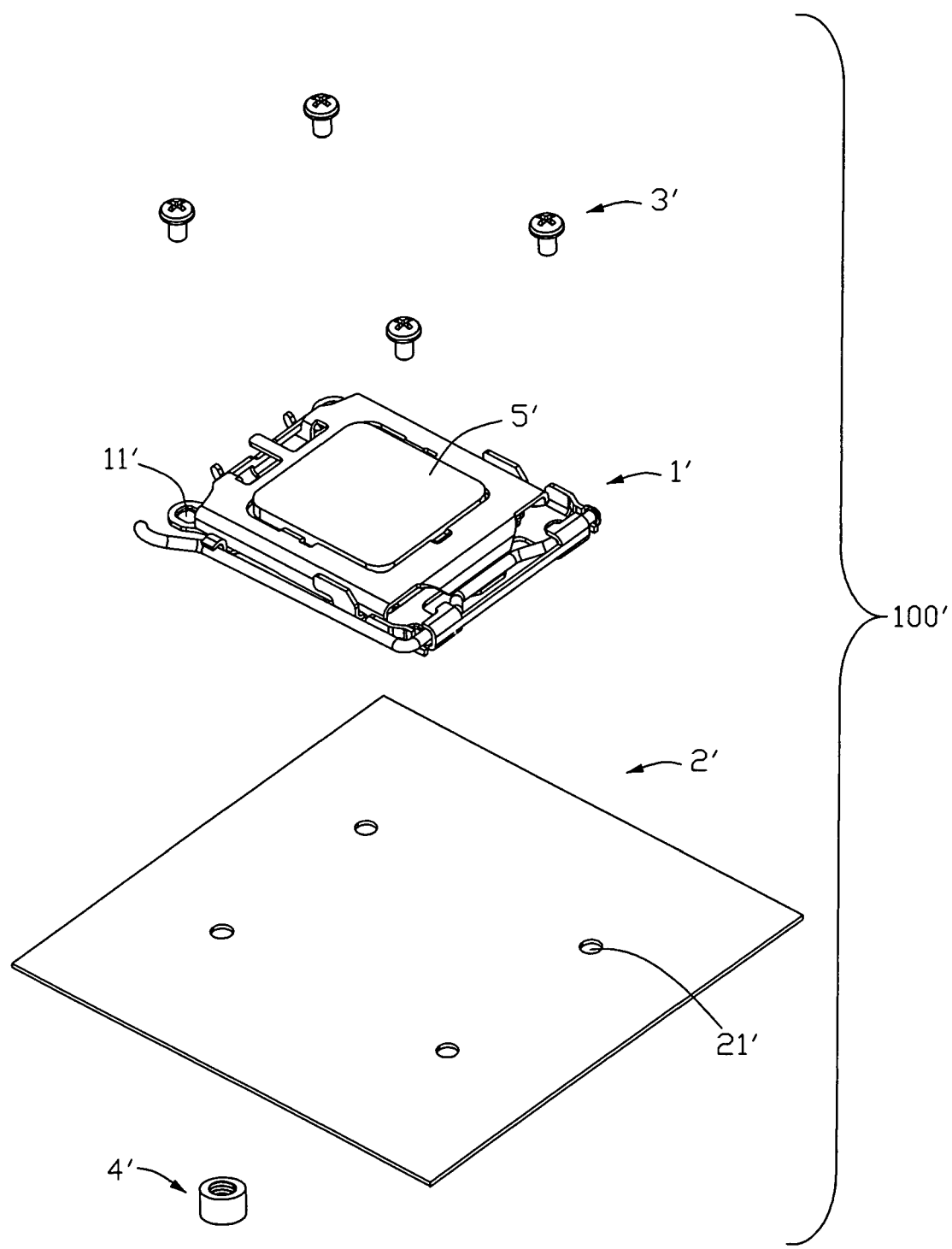
FIG. 4 is an exploded view of a conventional electrical connector assembly.

Referring to FIGS. 1 to 3, an electrical connector assembly 100 comprises an electrical connector 200 for electrically connecting an electronic package, such as an central processing unit (CPU) (not shown), with a circuit substrate, such as a printed circuit board (PCB) 60 and a connecting device 300 for fixing the electrical connector 200 to the PCB 60.

Referring to FIG. 1 and FIG. 2, the electrical connector 200 comprises a housing assembly 1, a lever 50 pivotaly mounted to one end of the housing assembly 1 and a metal clip 40 pivotally mounted to the other end of the housing assembly 1. The housing assembly 1 comprises an insulative housing 20 with a plurality of contacts 10 received therein and an stiffener 30 surrounding the insulative housing 20.

The insulative housing 20 comprises an supporting surface 201 for supporting the CPU and an assembled surface 202 opposite to the supporting surface 201 assembling to the PCB 60.

The stiffener 30 comprises a pair of long sidewalls 301 and a pair of short sidewalls 302. The long sidewalls 301 and the short sidewalls 302 make a receiving space 303 for receiving the insulative housing 20. The stiffener 30 includes a number of first holes 304 and a pair of retaining recesses 305. The PCB 60 comprises a number of second holes 601 corresponding to the first holes 304.

The metal clip 40 is a hollowed metal frame and comprises a pair of latching portions 401 matched with the retaining recesses 305 of the stiffener 30. The lever 50 is bent from a metal rod and comprises a cam portion 502 and an operating portion 503. Rotate the operating portion 503 can make the cam portion 502 pressing on a part of the metal clip 40.

Referring to FIG. 3, the connecting device 300 comprises a first screw 70, a second screw 90 and a nut 80 connecting the first screw 70 and the second screw 90. The nut 80 with a columniform comprises a first portion 801 and a second portion 802 with screw thread 803, and the diameter of the first portion 801 is smaller than that of the second portion 802.

Before the electrical connector 200 is assembled to the PCB 60, assemble the first screw 70 to the electrical connector 200, then match the nut 80 with the first screw 70. The diameter of the first portion 801 of the nut 80 is larger than that of the first hole 304 of the electrical connector 200, thus make the first screw 70 securely located on the electrical connector 200 and prevent losing in transportation.

When assembled the electrical connector 200 to the PCB 60, assembled the second screw 90 from the underside of the PCB 60, the second screw 90 go through the second hole 601 and matching with the nut 80, thus make the electrical connector 200 securely fixed on the PCB 60, and the diameter of the second portion 802 of the nut 80 is larger than that of the second hole 601, thus the nut 80 located between the electrical connector 200 and the PCB 60 as a standoff, which can make the electrical connector 200 fixed on the PCB 60 more securely.

In the above detailed description, before assembled the electrical connector 200 to the PCB 60, the nut 80 can make the first screw 70 securely located on the electrical connector 200, when assemble the electrical connector 200 to the PCB 60, put the second screw 90 go through the second hole 601 of the PCB and matching with the nut 80 directly, thus can make the electrical connector 200 securely fixed on the PCB 60, it is very expediently to assemble and can prevent losing the first screw 70 in transportation.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector assembly, comprising:
an electrical connector for connecting an electronic package with a circuit substrate and including a housing assembly and a plurality of first holes, the circuit substrate defining a plurality of second holes corresponding to the first holes;
a plurality of contacts disposed in the housing assembly;
a connecting device for fixing the electrical connector to the circuit substrate and including a first screw, a second screw and a nut for connecting with the first screw and the second screw; and
the nut matching with the first screw prior to the second screw to make the first screw securely locating on the electrical connector, the second screw being located under the circuit substrate and going through the second hole to connect with the nut, the nut supporting the electrical connector on the circuit substrate.

2. The electrical connector assembly as claimed in claim 1, wherein the nut is located between a bottom surface of the stiffener and a top surface of the circuit substrate.

3. The electrical connector assembly as claimed in claim 1, wherein the diameter of the nut is larger than that of the first hole and second hole.

4. The electrical connector assembly as claimed in claim 3, wherein the nut defines a first portion and a second portion.

5. The electrical connector assembly as claimed in claim 4, wherein the diameter of the second portion is larger than that of the first portion.

6. An electrical connector assembly comprising:
a printed circuited board defining opposite upper and lower surfaces thereon and a plurality of through apertures extending through both said upper and lower surfaces;
an electrical connector located above the upper surface and including a metallic stiffener defining a plurality of through holes in a periphery area and in alignment with the corresponding through apertures, respectively, and further defining a central large opening;
an insulative housing received in the central opening;
a metal clip pivotally mounted upon the other end of the stiffener;
a lever pivotally mounted upon the other end of the stiffener;
a plurality of connection devices assembling said stiffener to the printed circuit board, each of said connection devices around the corresponding through hole and through aperture including a peg, an upper fastening device and a lower fastening device discrete from one another,
said peg functioning as a standoff and is positioned between the stiffener and the printed circuit board and essentially aligned with the corresponding through hole thereabove and the corresponding through aperture thereunder, an upper fastening device fastened to an upper portion of the peg and cooperating with the peg to sandwich the stiffener therebetween, and a lower fastening device fastened to a lower portion of the peg and cooperating with the peg to sandwich the printed circuit board therebetween; wherein
at least one of said upper fastening device and said peg extends through the corresponding through hole, and at least one of said lower fastening device and said peg extends through the corresponding through aperture.

7. The electrical connector assembly as claimed in claim 6, wherein the peg is equipped with at least one of exterior and interior threads, and at least one of said upper fastening device and said lower fastening device is equipped with exterior threads for coupling to the peg.

8. The electrical connector assembly as claimed in claim 7, wherein said peg is a nut equipped with said internal threads, and at least one of said upper fastening device and said lower fastening device is a screw equipped with said exterior threads.

9. The electrical connector assembly as claimed in claim 6, wherein said upper fastening device extends through the corresponding through hole.

10. The electrical connector assembly as claimed in claim 6, wherein said lower fastening device extends through the corresponding through aperture.

11. An electrical connector for mounting upon a printed circuit board, comprising:
an electrical connector located above the upper surface and including a metallic stiffener defining a plurality of through holes in a periphery area and a central large opening;
an insulative housing received in the central opening;
a metal clip mounted upon one end of the stiffener;
a lever engaged with the clip around the other end of the stiffener;
a plurality of connection devices for fastening said stiffener to the printed circuit board, each of said connection devices including:
a peg intimately located below an undersurface of the stiffener and in alignment with the corresponding through hole,
an upper fastening device fastening to an upper portion of said peg via the corresponding through hole to sandwich said stiffener therebetween; and
a lower fastening device configured to be fastened to a lower portion of the peg for sandwiching the printed circuit board therebetween.

12. The electrical connector assembly as claimed in claim 11, wherein the peg is equipped with at least one of exterior and interior threads, and at least one of said upper fastening device and said lower fastening device is equipped with exterior threads for coupling to the peg.

13. The electrical connector assembly as claimed in claim 12, wherein said peg is a nut equipped with said internal threads, and at least one of said upper fastening device and said lower fastening device is a screw equipped with said exterior threads.

14. The electrical connector assembly as claimed in claim 11, wherein said upper fastening device extends trough the corresponding through hole.

15. The electrical connector assembly as claimed in claim 6, wherein the nut is located between a bottom surface of the stiffener and a top surface of the circuit substrate.

16. The electrical connector assembly as claimed in claim 11, wherein the upper fastening device defines an upper large dimension section downwardly seated upon the stiffener, a middle mid dimension section received in said through hole of the stiffener, and a lower smaller dimension section received in the upper portion of the peg.

* * * * *